(12) United States Patent
Petti et al.

(10) Patent No.: US 8,004,013 B2
(45) Date of Patent: Aug. 23, 2011

(54) POLYCRYSTALLINE THIN FILM BIPOLAR TRANSISTORS

(75) Inventors: Christopher J Petti, Mountain View, CA (US); S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 785 days.

(21) Appl. No.: 11/763,816

(22) Filed: Jun. 15, 2007

(65) Prior Publication Data

US 2008/0308903 A1   Dec. 18, 2008

(51) Int. Cl.
*H01L 31/0336* (2006.01)
*H01L 27/102* (2006.01)
*H01L 29/70* (2006.01)
*H01L 31/11* (2006.01)

(52) U.S. Cl. .............. 257/197; 257/565; 257/584

(58) Field of Classification Search .............. 257/197, 257/565–584, E31.073
See application file for complete search history.

(56) References Cited

U.S. PATENT DOCUMENTS

| | | |
|---|---|---|
| 5,144,403 A | 9/1992 | Chiang et al. |
| 5,296,388 A | 3/1994 | Kameyama et al. |
| 5,580,792 A | 12/1996 | Zhang et al. |
| 5,804,473 A | 9/1998 | Takizawa |
| 5,814,835 A | 9/1998 | Makita et al. |
| 5,973,372 A | 10/1999 | Omid-Zohoor et al. |
| 6,194,255 B1 | 2/2001 | Hiroki et al. |
| 6,362,066 B1 * | 3/2002 | Ryum et al. ......... 438/364 |
| 6,558,986 B1 | 5/2003 | Choi |
| 6,586,287 B2 | 7/2003 | Joo et al. |
| 6,770,515 B1 | 8/2004 | Makita et al. |
| 6,879,505 B2 | 4/2005 | Scheuerlein |
| 6,881,994 B2 | 4/2005 | Lee et al. |
| 6,946,719 B2 | 9/2005 | Petti et al. |
| 6,952,030 B2 | 10/2005 | Herner et al. |
| 7,012,009 B2 * | 3/2006 | Lee et al. ......... 438/312 |
| 7,098,089 B2 | 8/2006 | Paik |
| 7,148,570 B2 | 12/2006 | Herner et al. |
| 7,176,064 B2 | 2/2007 | Herner |
| 7,233,024 B2 | 6/2007 | Scheuerlein et al. |
| 2002/0036944 A1 | 3/2002 | Fujimoto |
| 2004/0166655 A1 | 8/2004 | Wong et al. |

(Continued)

FOREIGN PATENT DOCUMENTS

WO   WO 2004/090968 A1   10/2004

OTHER PUBLICATIONS

Dec. 19, 2009 Reply to Office Action of related U.S. Appl. No. 11/763,876 mailed Sep. 30, 2009.

(Continued)

*Primary Examiner* — Cuong Q Nguyen
(74) *Attorney, Agent, or Firm* — Dugan & Dugan, PC

(57) ABSTRACT

A semiconductor device comprising a bipolar transistor having a base region, an emitter region and a collector region, wherein the base region comprises polycrystalline semiconductor material formed by crystallizing silicon, germanium or silicon germanium in contact with a silicide, germanide or silicide germanide is described. The emitter region and collector region also may comprise polycrystalline semiconductor material formed by crystallizing silicon, germanium or silicon germanium in contact with a silicide, germanide or silicide germanide forming metal. The polycrystalline semiconductor material is preferably silicided polysilicon, which is formed in contact with C49 phase titanium silicide.

30 Claims, 8 Drawing Sheets

U.S. PATENT DOCUMENTS

| | | | |
|---|---|---|---|
| 2004/0180543 A1* | 9/2004 | Lee et al. | 438/683 |
| 2004/0188714 A1 | 9/2004 | Scheuerlein et al. | |
| 2005/0001238 A1* | 1/2005 | Oue et al. | 257/197 |
| 2005/0072976 A1 | 4/2005 | Cleeves et al. | |
| 2005/0226067 A1 | 10/2005 | Herner et al. | |
| 2006/0006495 A1 | 1/2006 | Herner et al. | |
| 2007/0087508 A1 | 4/2007 | Herner | |
| 2008/0311710 A1 | 12/2008 | Herner et al. | |
| 2008/0311722 A1 | 12/2008 | Petti et al. | |

OTHER PUBLICATIONS

International Search Report and Written Opinion of International Application No. PCT/US2008/007439 mailed Nov. 18, 2008.

Herner et al., "Polysilicon Memory Switching: Electrothermal-Induced Order," IEEE Transactions on Electron Devices, Sep. 2006, pp. 2320-2327, vol. 53, No. 9.

Notice of Allowance of U.S. Appl. No. 11/763,876 mailed Sep. 1, 2010.

Supplemental Notice of Allowability of U.S. Appl. No. 11/763,876 mailed Nov. 22, 2010.

Office Action of U.S. Appl. No. 11/763,876 mailed Sep. 30, 2009.

Notice of Allowance of related U.S. Appl. No. 11/763,876 mailed Mar. 23, 2010.

Herner, et al., "Polysilicon Memory Switching: Electrothermal-Induced Order," IEEE Electron Device Letters, Sep. 2006, pp. 2320-2327, vol. 53, No. 9.

Herner, et al., "Effect of Ohmic Contacts on Polysilicon Memory Effects," Mater Res. Soc. Sym. Proc., (2005), pp. E5.6.1-E5.6.6, vol. 864.

Tiang, et al. "Twinning in TiSi2-Island Catalyzed Nanowires Grown by Gas-Source Molecular-Beam Epitaxy," Applied Physics Letters, (2002), vol. 81, No. 13.

Restriction Requirement of U.S. Appl. No. 11/763,876 mailed Feb. 13, 2009.

Mar. 11, 2009 Reply to Restriction Requirement of U.S. Appl. No. 11/763,876 mailed Feb. 13, 2009.

Jun. 30, 2009 Reply to Mar. 30, 2009 Office Action of U.S. Appl. No. 11/763,876.

"Method for Forming N+-P+ Tunnel Junctions". IBM Technical Disclosure Bulletin vol. 25, No. 11B (1983): pp. 6147-6149.

Office Action of U.S. Appl. No. 11/763,876 mailed Mar. 30, 2009.

* cited by examiner

POLYCRYSTALLINE THIN FILM BIPOLAR TRANSISTORS

CROSS-REFERENCE TO RELATED APPLICATIONS

This application is related to Herner et al., U.S. patent application Ser. No. 11/763,671, entitled "Method To Form Low-Defect Polycrystalline Semiconductor Material For Use In A Transistor," and to Petti et al., U.S. patent application Ser. No. 11/763,876, entitled "Method For Forming Polycrsytalline Thin Film Bipolar Transistors," which are being filed herewith and which are hereby incorporated by reference.

BACKGROUND OF THE INVENTION

Bipolar transistors typically are formed in single crystal silicon. Single crystals of other semiconductor materials, such as germanium, silicon germanium and other semiconductor materials, also are sometimes used. Polycrystalline forms of silicon ("polysilicon"), germanium ("polygermanium"), and silicon germanium ("polysilicon polygermanium") typically are not used to make bipolar transistors because usually these materials do not provide sufficient current gain for electronic applications of this type. This is because the current gain of a bipolar transistor is related to the lifetime of minority carriers in its base. In typical single-crystal silicon substrates, for example, these lifetimes can be in excess of $10^{-3}$ sec. However, for typical polysilicon films, these lifetimes are on the order of $10^{-12}$ sec. Carrier lifetimes are determined by the density of defects in the material, which act as recombination centers that take free carriers out of the film. The polysilicon films have very high defect densities, which accounts for the low carrier lifetimes.

One application for a transistor is as a memory select device for a three dimensional memory array of one time programmable or rewriteable memory cells. The array typically extends above a substrate, which typically is a silicon wafer or die, but also may include other materials, such as, for example, glass, other semiconductor materials, metal, plastic, silicon dioxide or aluminum oxide. These memory select devices are usually disposed on the substrate, not up in the array of memory cells.

One type of three dimensional memory array is a stacked, monolithic three dimensional memory array. The term "monolithic" as used herein means that layers of each level of the array were directly deposited or grown on the layers of each underlying level of the array. In contrast, two dimensional arrays may be formed separately and then packaged together to form a non-monolithic memory device. In general, to program a given memory cell within the three dimensional memory array, it is necessary to have multiple memory select devices, which direct a programming voltage to the particular cell that is to be programmed in response to signals from control circuitry disposed on the substrate. For monolithic three dimensional memory arrays in particular, memory select devices, such as bit-line select transistors, typically can take up anywhere from around 10-20% of the total die area underneath the array. This leaves less space for control and other circuitry in the substrate or requires a larger substrate base to incorporate the control circuitry and the memory select transistors.

SUMMARY OF THE PREFERRED EMBODIMENTS

The present invention is defined by the following claims, and nothing in this section should be taken as a limitation on those claims.

In one embodiment, the invention is directed to a semiconductor device comprising a bipolar transistor having a base region, an emitter region and a collector region, wherein the base region comprises polycrystalline semiconductor material formed by crystallizing silicon, germanium or silicon-germanium in contact with a silicide, germanide or silicon germanide forming metal. The emitter region and collector region also may comprise polycrystalline semiconductor material formed by crystallizing silicon, germanium or silicon-germanium in contact with a silicide, germanide or silicide-germanide. The polycrystalline semiconductor material is preferably silicided polysilicon, which is formed in contact with C49 phase titanium silicide. Another embodiment of the invention provides for a monolithic three dimensional memory array comprising a plurality of semiconductor elements in a stacked array above a substrate, the array comprising one or more levels of semiconductor elements; one or more thin film bipolar transistors disposed in the stacked array above the substrate, each semiconductor element being operatively connected to one or more of the bipolar transistors, wherein the bipolar transistors comprise silicided polysilicon.

Another embodiment of the invention provides for a monolithic three dimensional memory array comprising an array of multiple levels of memory cells stacked above a substrate, the array comprising a plurality of memory cell rows and memory cell columns in each level; one or more thin film bipolar transistors disposed in the array above the substrate, in operative connection to one or more of the memory cells; and wherein the memory cells and transistors comprise silicided polysilicon. Other preferred embodiments are provided, and each of the preferred embodiments can be used alone or in combination with one another.

Several embodiments of the invention will now be described with reference to the attached drawings.

DETAILED DESCRIPTION OF THE PREFERRED EMBODIMENTS

Figure 1:
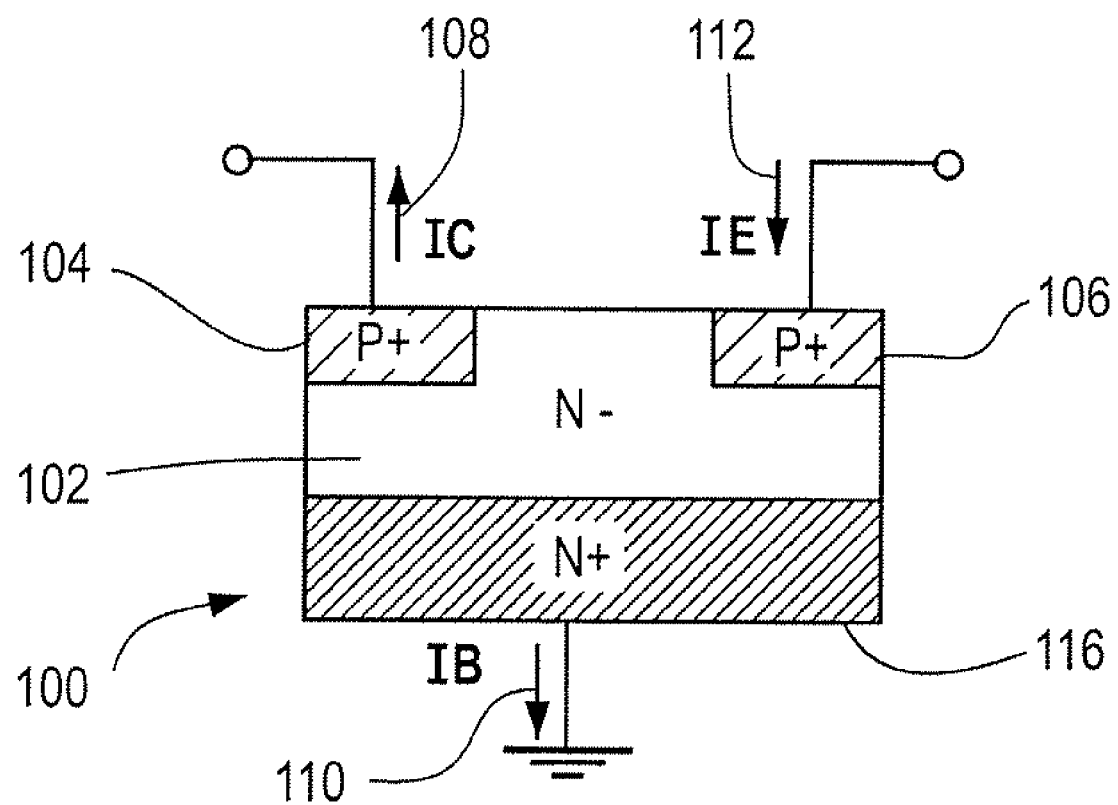
FIG. 1 is a cross-sectional view of a thin-film bipolar transistor formed according to a preferred embodiment of the present invention

In the present application, a bipolar transistor is formed having its base region in deposited semiconductor material. The performance of the bipolar transistor is improved by improving the quality of the semiconductor material. A method is disclosed to crystallize deposited semiconductor material having larger grain size and fewer crystal defects. The method is most effective when used with features having relatively small feature size, for example about 0.25 microns or less. By improving crystallinity of the semiconductor material, performance of the device is improved.

It is known to use various metals, such as nickel, cobalt, and titanium, to improve the crystallinity of deposited silicon. (Silicon is the most commonly used semiconductor material.) Other metals such as chromium, tantalum, platinum, niobium, or palladium are sometimes used. Different metals work to improve crystallinity by different mechanisms, however.

It is known to deposit a thin film of amorphous silicon, and then to deposit some amount of nickel on the silicon. During a subsequent anneal, nickel serves as a crystallization catalyst. A front of nickel, or a composite front containing nickel, advances through the silicon, leaving large-grained polysilicon behind it. In this crystallization mechanism, nickel actually travels through the silicon, and some residual amount may remain behind as a contaminant, which may adversely affect the device, or even ruin it.

Other metals, such as titanium and cobalt, can also serve to improve crystallinity of deposited silicon, but do so by a different mechanism. When a silicide-forming metal such as titanium or cobalt is in contact with amorphous silicon and is annealed, the silicon reacts with the titanium or cobalt to form titanium silicide or cobalt silicide. The silicide begins to form at a temperature which is less than the crystallization temperature of amorphous silicon. Many such silicides have a lattice structure very close to that of silicon. The silicide can behave as a template for the silicon lattice as the silicon crystallizes, causing it to form large grains having few defects such as microtwins, as described in S. B. Herner, A. Bandyopadhyay, C. Jahn, D. Kidwell, C. J. Petti, and A. J. Walker, "Polysilicon memory switching: Electrothermal-induced order," *IEEE Transactions on Electron Devices*, September, 2006, vol. 53, issue 9, pp. 2320-2327, hereby incorporated by reference. With metals such as cobalt and titanium, the silicon grows from a silicide template, the silicon crystalline/amorphous interface advancing from the original silicon/silicide interface. The metal itself does not tend to migrate through the silicon during crystallization, however. Thus the danger of metal contamination is greatly reduced, and the resulting polysilicon is suitable for use in a bipolar transistor. Silicon crystallized in contact with a metal silicide will be referred to in this discussion as silicided polysilicon.

Titanium silicide may be in any of several crystal phases, each of which has a different lattice structure. The terminal phase, C54, is the lowest-resistivity phase, and thus is the phase most generally preferred in semiconductor devices when the titanium silicide is used as an electrical contact or as a conductor. The C49 phase of titanium silicide, however, has a better lattice match to silicon. Thus to provide a crystallization template for silicon, the C49 phase of titanium silicide is preferred. The phase transformation from C49 to C54 titanium silicide tends to emanate from grain boundary triple points, where three grains come together. At very small feature size (about 0.25 micron or less) these grain boundary triple points are rare, and the C49-to-C54 phase transformation is inhibited. In embodiments of the present invention, then, titanium silicide may be used to improve the quality of polysilicon at small feature size, where the C49 phase dominates. Other appropriate silicides having advantageous lattice matches to silicon also may be used. Note that the inhibition of the C49-to-C54 phase transformation at small feature size does not occur with other silicides such as cobalt silicide.

Thus far the use of appropriate silicides to provide a crystallization template for polysilicon has been described. It is expected, however, that if silicon is replaced with germanium or with a silicon-germanium alloy, then germanide or silicide-germanide will form instead of silicide, and that the germanide or silicide-germanide will also serve as a crystallization template, forming high-quality, low-defect polygermanium or polysilicon-polygermanium.

FIG. 1 shows one embodiment of the invention comprising a p-n-p bipolar junction transistor 100 having an intrinsic base region 102 comprising silicided polysilicon. The intrinsic base region 102 is preferably undoped, although it tends to exhibit slightly n-type behavior, and may be lightly doped with a n-type dopant such as phosphorous. This intrinsic base region 102 is contacted by a more heavily doped N+ region (116), referred to as the extrinsic base region. Both regions 116 and 102 are collectively known as the base region of the transistor. The transistor 100 also includes a collector region 104 and an emitter region 106 that also comprise silicided polysilicon. The emitter and collector regions are doped with a p-type dopant, such as boron, with the preferred doping method being ion implantation. Depending on the desired application, the emitter and collector regions may be interchanged, and may be formed from substantially the same compositions. When, for example, the transistor is used as a memory select device at a given level in a monolithic three dimensional memory array, the collector region is closest to the memory cells within that level.

Alternatively, the transistor can readily be arranged as a n-p-n transistor by intentionally doping the intrinsic base region with a low dose of p-type ions, such as boron. The extrinsic base region would be more heavily doped with a p-type dopant, and the emitter and collector regions would be heavily doped with an n-type dopant.

Referring to the p-n-p bipolar transistor of FIG. 1, when the bipolar transistor is biased in the active mode, holes are injected from emitter 106 into intrinsic base 102 and flow through to collector 104, with associated emitter current (IE) 112, base current (IB) 110 and collector current (IC) 108.

In a preferred embodiment, a bipolar junction transistor is fabricated having its base formed in deposited silicon crystallized in contact with a silicide, preferably titanium silicide or cobalt silicide, though other appropriate silicides may be used instead. Alternatively, the base may be formed of silicon-germanium or germanium that is crystallized in contact with silicide-germanide or germanide formed by reaction with one of these metals.

As noted above, one preferred application for the inventive transistor is in a monolithic three dimensional memory array as a memory select device. However, the inventive bipolar transistors are not limited to memory applications and could be used in a variety of other applications that require bipolar transistors. The memory cells of the three dimensional memory array preferably comprise vertically oriented p-i-n diodes. In this embodiment, the transistor 100 is preferably formed during the fabrication of the memory cells, and is formed by the same process steps.

A detailed example will be provided of an embodiment of the present invention. In the example to be described, the bipolar junction transistors serve as switching elements in a monolithic three dimensional memory array in which each memory cell comprises a vertically oriented p-i-n diode paired with a dielectric rupture antifuse. Fabrication of an array of such memory cells is described in Herner, U.S. patent application Ser. No. 11/560,283, filed Nov. 15, 2006, entitled "Method for Making a P-I-N Diode Crystallized Adjacent to a Silicide In Series With a Dielectric Antifuse," (hereinafter "Herner '283 application"), which is a continuation-in-part of Herner, U.S. patent application Ser. No. 10/954,510, which is a continuation-in-part of Petti et al., U.S. Pat. No. 6,946,719, all owned by the assignee of the present invention and all hereby incorporated by reference. Additional details concerning the fabrication of monolithic three dimensional memory arrays can be found in Herner et al., U.S. Pat. No. 6,952,030, "High-density three-dimensional memory cell," which is owned by the assignee of the present invention and which is hereby incorporated by reference. To avoid obscuring the invention, not all of the details of these applications will be included, but it will be understood that no teaching is intended to be excluded.

Figure 2A:
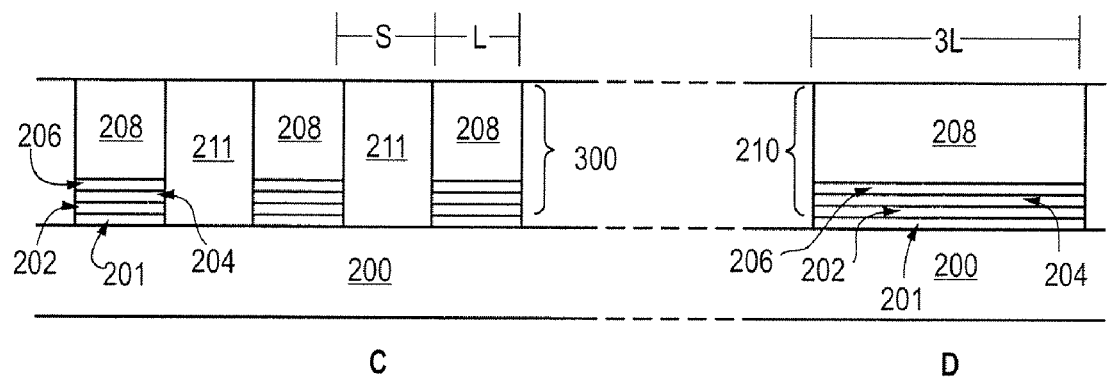
FIGS. 2a-2c are cross-sectional views showing stages in formation of a memory level in which switching elements are bipolar junction transistors formed according to an embodiment of the present invention.

Fabrication of the example array begins over a suitable substrate, for example a monocrystalline silicon wafer, and an insulating layer formed above the wafer. Turning to FIG. 2a, rail-shaped conductor 200 is formed above the substrate and insulating layer, which are not shown. Conductor 200 is shown in cross-section, extending left-to-right across the page. Conductor 200 is one of a plurality of substantially parallel, substantially coplanar conductors, and is formed of suitable conductive materials, for example tungsten with titanium nitride as an adhesion layer. Conductors 200 are preferably formed by a Damascene method; thus the space between them is filled with dielectric material (not shown), with the dielectric material and conductors 200 exposed at a substantially planar surface. Area C is within the array, while area D is at the edge of the array. Some distance may separate areas C and D, as indicated by dashed lines.

Optional barrier layer 201, for example of titanium nitride, is formed on the planar surface, followed by dielectric rupture antifuse 202, preferably of a high-K dielectric such as, for example, $SiO_2$, $Al_2O_3$, $HfO_2$ or $HfSiO_2$. Any of a number of other materials such as SiN, $ZrO_2$, $TiO_2$, $La_2O_3$, $Ta_2O_5$, $RuO_2$, $ZrSiO_x$, $AlSiO_x$, $HfSiO_x$, $HfAlO_x$, HfSiON, $ZrSiAlO_x$, $HfSiAlO_x$, HfSiAlON, and ZrSiAlON, or these materials combined with $SiO_2$ (e.g. $HfSiO_x$) or SiN (e.g. HfSiN) or both (e.g. HfSiON), may be formed above the bottom conductive layer 200 in operative connection therewith. For example, dielectric rupture antifuse 202 may include $SiO_2$, $Al_2O_3$, $HfO_2$ $HfSiO_2$, SiN, $ZrO_2$, $TiO_2$, or any mixture thereof.

Optional barrier layer 204, for example of titanium nitride, is formed on dielectric rupture antifuse 202. A layer 206 of heavily doped silicon, for example doped in situ by an n-type dopant such as phosphorus, is deposited on titanium nitride layer 204. Undoped or lightly doped silicon layer 208 is deposited on heavily doped n-type layer 206. Silicon layers 208 and 206 are preferably amorphous as deposited.

Next undoped silicon layer 208, heavily doped n-type layer 206, titanium nitride barrier layer 204, dielectric rupture antifuse 202, and titanium nitride barrier layer 201 are patterned and etched. Within array area C, these layers are etched into pillars 300, which will be substantially cylindrical. At the edge of the array, in area D, at the end of each conductor 200, a more elongate shape 210, is formed instead, as shown. The minimum feature size of pillars 300 (their diameter) is about 0.25 micron or less, for example 0.13 micron, 0.065 micron, 0.045 micron, 0.03 micron, or less. Each pillar 300 within a given level has a width (diameter in a cross sectional view), L, where L is approximately equal to 0.25 microns or less, and the pillars are spaced apart a distance S, which is approximately equal to L. In this example, elongate shapes 210 have about the same width L (cross sectional minor axis) as pillars, but their length is 3 L (cross sectional major axis), in this embodiment about three times that width. A dielectric material such as high-density plasma (HDP) oxide 211 is deposited over and between the etched features, filling gaps between them. A planarization step, for example by chemical mechanical planarization (CMP), exposes undoped silicon layer 208 at a substantially planar surface in both areas C and D. The structure at this point is shown in FIG. 2a.

Figure 2B:
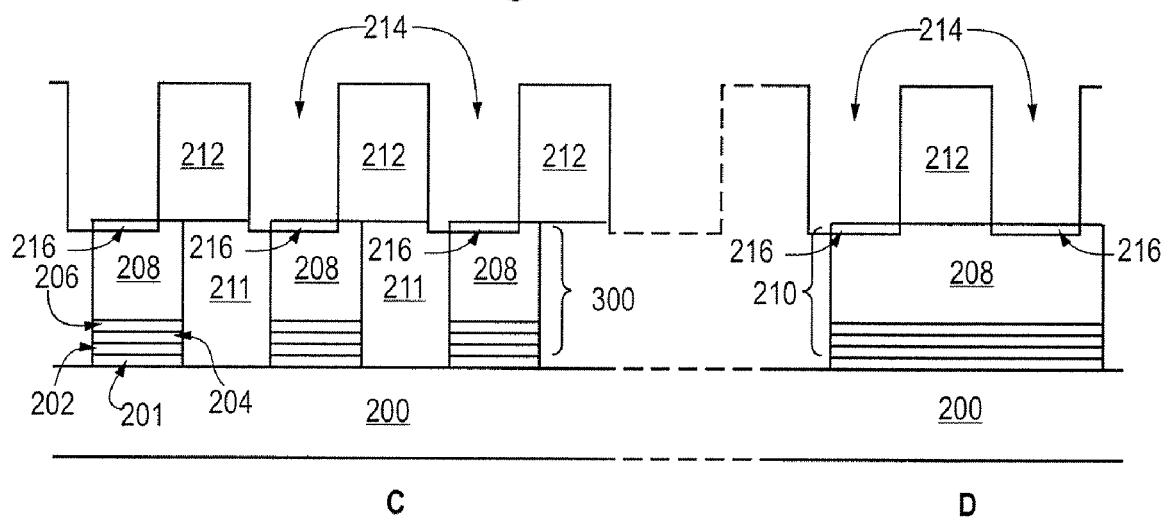

Turning to FIG. 2b, next a thickness of dielectric material 212 is deposited, and trenches 214 etched in dielectric material 212. Trenches 214 are preferably substantially perpendicular to conductors 200, and are shown in FIG. 2b in cross-section extending out of the page. Within area C, each trench 214 ideally aligns with one of the pillars 300; some misalignment likely will occur and can be tolerated. In area D, at the edge of the array, two trenches 214 will contact elongate shape 210. An ion implantation step is performed, forming heavily doped p-type regions 216. In array area C, each pillar 300 is now a vertically oriented p-i-n diode, having bottom heavily doped n-type region 206, undoped region 208, and top heavily doped p-type region 216. In area D, each elongate shape 210 now includes two heavily doped p-type regions 216, which will ultimately serve as the emitter and collector of the bipolar junction transistor to be formed.

Figure 2C:
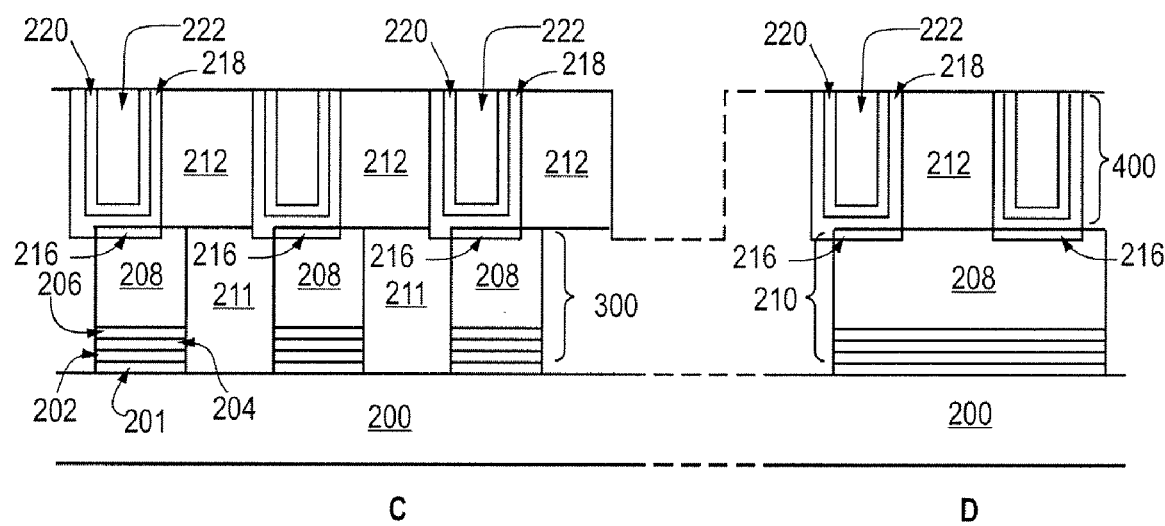

Turning to FIG. 2c, trenches 214 are filled with a silicide forming metal such as titanium layer 218, and other appropriate conductive material, for example titanium nitride layer 220 and tungsten layer 222. A CMP step to remove overfill of the conductive layers forms top conductors 400, which preferably extend substantially perpendicular to bottom conductors 200. A rapid thermal anneal is performed, preferably at 750° C. for 60 seconds, to react titanium layer 218 with the silicon of heavily doped p-type regions 216, forming titanium silicide. In this example titanium was used, though other appropriate silicide-forming metals named earlier could have been used instead. This anneal also crystallizes the silicon of regions 216, 208, and 206 in pillars 300 and elongate shapes 210. Note that if layer 218 was titanium, then titanium silicide (not shown) formed where titanium layer 218 contacted silicon regions 216 will be predominantly or entirely C49 phase titanium silicide, as the feature size of pillars 300 and elongate shapes 210 is very small. Thus this titanium silicide will provide a template during crystallization of the silicon of pillars 300 and elongate shapes 210, and this silicon will have few defects and large grain size. By applying appropriate voltages, the dielectric rupture antifuse 202 of the elongate regions 210 can be ruptured, for example in the factory before delivery to the end user. Each elongate region 210 is a bipolar junction transistor, with heavily doped p-type regions 216 serving as emitter and collector, with the collector being the doped p-type region 216 of area D that is closest to area C. Intrinsic region 208 serves as the intrinsic base.

Fabrication of a first memory level above a substrate has been described. Such a plurality of devices formed at the same level above a substrate can be referred to as a device level. It should be understood that one, two, or more additional monolithically formed levels of memory cells are stacked above this exemplary level in the array, with each additional level being formed in substantially the same way as the first memory level described above, except that the last rapid thermal anneal need not be performed for every layer. It can be performed once, after all layers have been formed.

Although the base region 208 of bipolar transistor 210 tends to exhibit slightly n-type behavior even without doping, alternatively, an n-type dopant such as phosphorous may be used in base region 208. Since this base region is formed in the same processing steps that form region 208 of pillars 300, it is most convenient for regions 208 in area C (the pillars) and area D (the bipolar transistors) to have the same doping level.

In the embodiment just described, the memory cells included p-i-n diodes having a heavily doped n-type region on the bottom and a heavily doped p-type region on top, while a p-n-p bipolar transistor was formed at the same memory level in the same processing steps. In alternative embodiments, the p-i-n diodes could be inverted, having a heavily doped p-type region on the bottom and a heavily doped n-type region on top, while an n-p-n bipolar transistor is formed in the same processing steps.

Figure 2D:
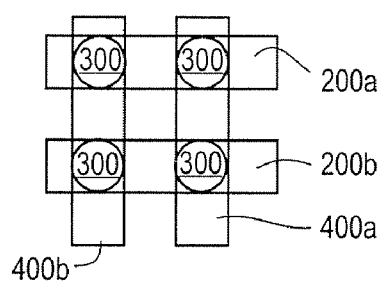
FIG. 2d is a plan view of two rows of memory cells of the type included within area C of FIG. 2c.

As noted above, the memory cells being depicted in cross section in FIGS. 2a-2c are part of a memory level in a monolithic array of such memory levels. FIG. 2d is a plan view of four of the pillars 300 connected by two columns of conductive elements 400a and 400b on top (bitlines) and two rows of conductive elements 200a and 200b on the bottom (wordlines).

Figure 2E:
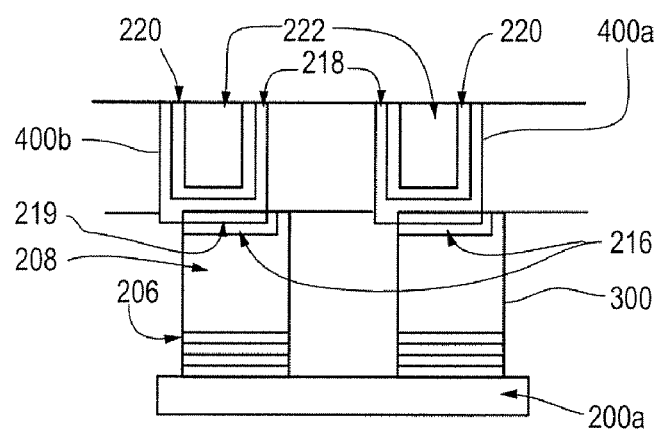
FIG. 2e is a more detailed cross-sectional view of a pair of memory cells shown in FIGS. 2c and 2d.

FIG. 2e is a cross sectional view of two of the pillars 300, with elements corresponding to elements shown in area C of FIG. 2c. These elements include titanium layer 218, titanium nitride layer 220, tungsten layer 222, which together make up top conductors 400a and 400b, doped p-type regions 216, titanium silicide layer 219 and bottom conductor 200a. Also shown are middle undoped region 208 and bottom heavily doped n-type region 206.

Figure 2F:
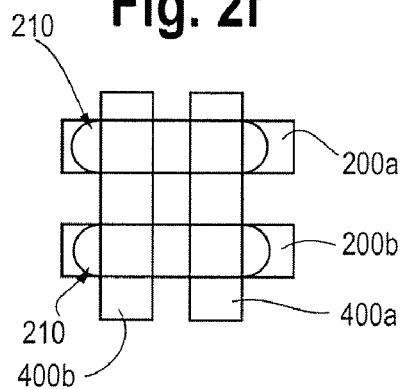
FIG. 2f is a plan view of a pair of bipolar junction transistors as shown in area D of FIG. 2c.

FIG. 2f is a plan view of two of the inventive bipolar transistors 210. Each transistor is disposed parallel to a bottom conductive element 200a or 200b and perpendicular to top conductive elements 400a and 400b.

Figure 2G:
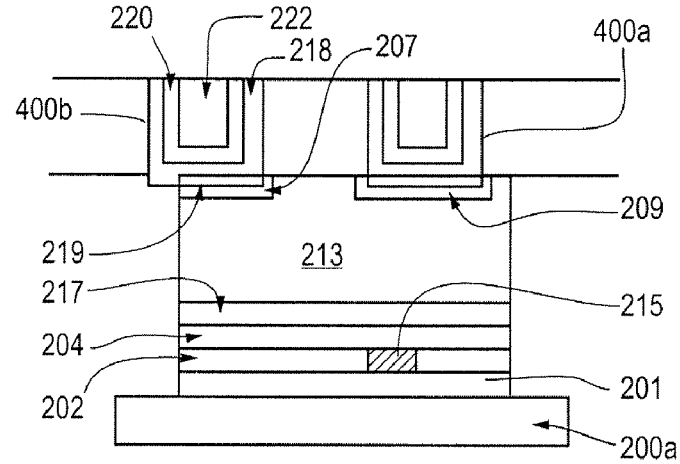
FIG. 2g is a more detailed cross-sectional view of the bipolar junction transistors of FIGS. 2c and 2f.

FIG. 2g is a cross sectional view of a bipolar transistor 210 corresponding to one of the transistors depicted in FIG. 2f with elements roughly corresponding to the elements shown in area D of FIG. 2c. These elements include titanium layer 218, titanium nitride layer 220, tungsten layer 222, top conductors 400a and 400b, titanium silicide layer 219, optional TiN barrier layers 201 and 204, antifuse layer 202, and bottom conductor 200a. The transistor 210 comprises collector region 207, emitter region 209 and a base region, which comprises the intrinsic base region 213 and the extrinsic base region 217. The conductors 400a and 400b form the metallic connections to the collector and emitter regions of the bipolar transistor and are referred to as its collector and emitter terminals. Also depicted in this view is a rupture 215 in the antifuse layer 202; the rupture region is shown cross-hatched. This rupture is formed by applying a programming voltage Vpp between the conductor 400a connected to the emitter region 209, or the conductor 400b connected to the collector region 207, and the bottom conductor 200a. After the antifuse is ruptured, the conductor 200a is electrically connected to the extrinsic base region 217 of the transistor, and is thus referred to as the base terminal of the device.

Figure 2H:
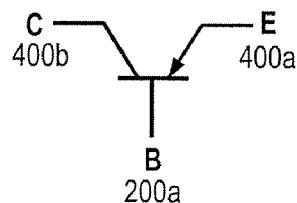
FIG. 2h is a schematic for the bipolar transistor of FIG. 2g.

FIG. 2h is a schematic for the bipolar transistor 210 of FIG. 2g, depicting collector terminal 400b, emitter terminal 400a and base terminal 200a.

Although a bottom antifuse arrangement is preferred, an alternative embodiment of the invention contemplates forming the antifuse as the top layer. In this embodiment, the top antifuse layer may be, for example, disposed above the titanium silicide and titanium layers and below the remaining layers of the top conductor, with conductive (TiN) barrier layers disposed adjacent top and bottom surfaces of the top antifuse layer. Additional details on the formation of contiguous p-i-n diodes and high-k dielectric rupture antifuses may be found in the Herner '283 application, incorporated by reference above. If a top antifuse arrangement is used, it may be necessary to add an additional masking step to remove portions of the top antifuse layer and gain electrical access to the collector or emitter region of the bipolar transistor, one or both of which may not be electrically accessible.

An alternative embodiment of the invention contemplates omitting the antifuse layer from the bipolar transistor. The antifuse layer is not necessary for operation of the bipolar transistor. However, in some embodiments it is required for operation of the memory cells. Therefore, it may be more convenient to include the antifuse layer on the transistor to save processing steps and to allow the transistor to be formed at substantially the same time as the memory cells.

Figure 3:
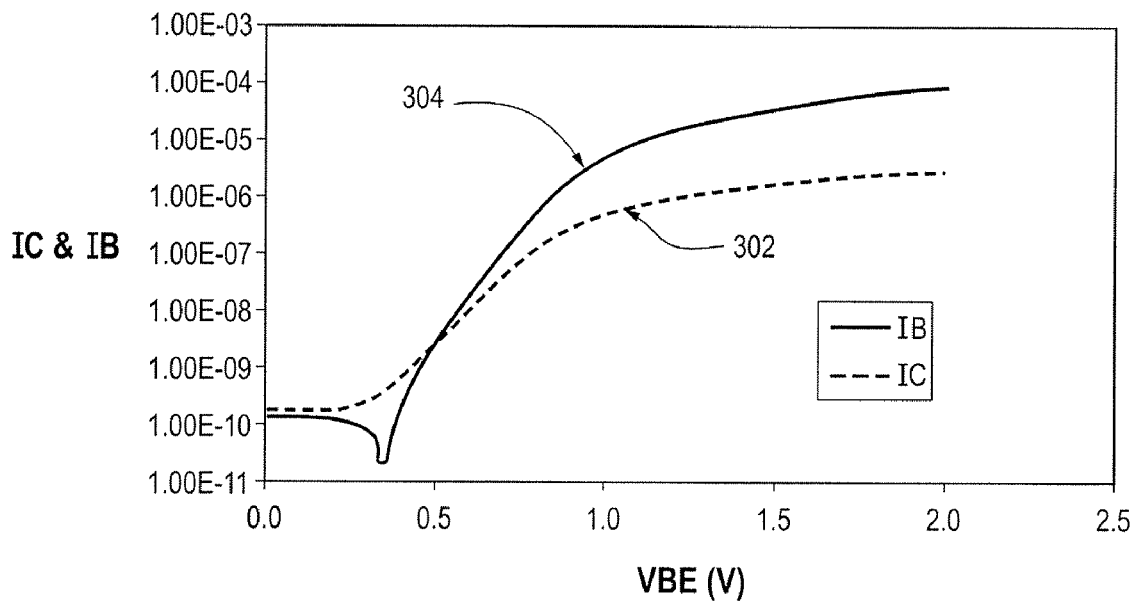
FIG. 3 is a Gummel plot of collector current and base current vs. base emitter voltage for a p-n-p transistor made from non-silicided polysilicon material.

FIG. 3 shows a Gummel plot of base current (IB) 304 and collector current (IC) 302 vs. emitter base voltage (VBE) for a bipolar transistor for a p-n-p transistor made from unsilicided polysilicon. The gain is measured as IC/IB. It is generally desirable for a bipolar transistor to have a gain in excess of 1. As can be seen from the plot, IC 302 for most voltages of interest is less than IB 304, which means that the transistor gain is less than 1.

Figure 4:
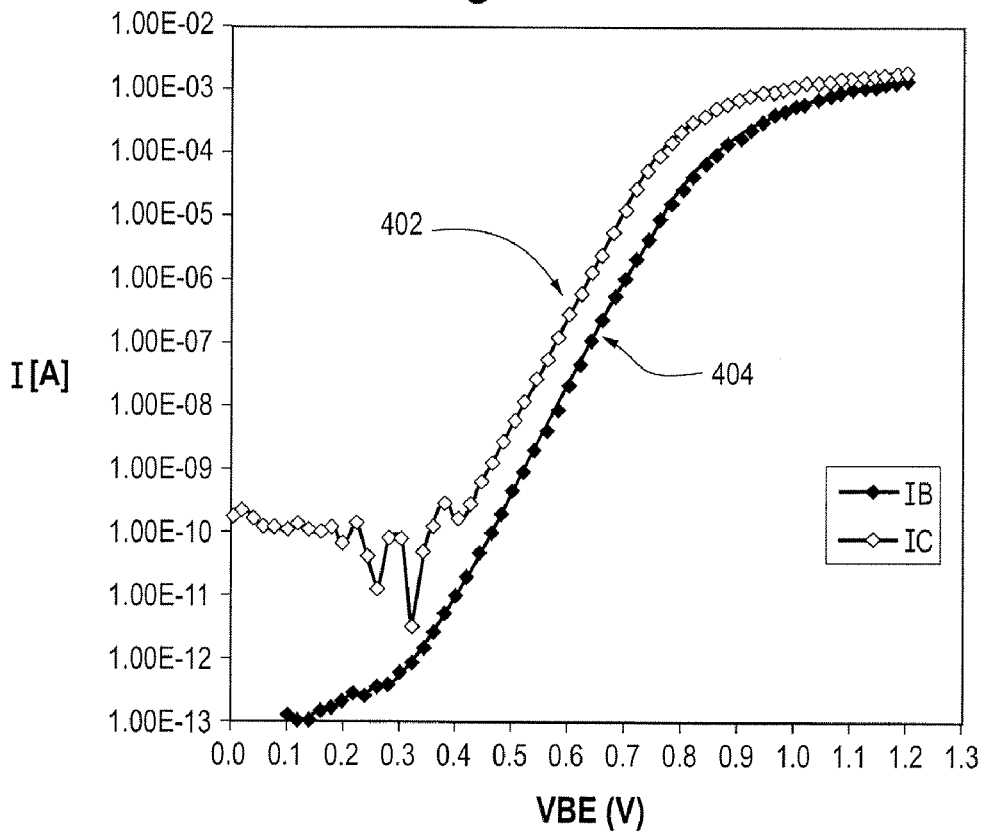
FIG. 4 is a Gummel plot of collector current and base current vs. base emitter voltage for a p-n-p transistor made from single crystal silicon material.

By contrast, referring to FIG. 4, which shows a Gummel plot for a p-n-p transistor made from single crystal silicon, it can be seen that the IC 402 is significantly greater than the IB 404, and the resulting gain is well in excess of 1, approaching a gain of 10. It is believed that a bipolar transistor made from silicided polysilicon also will demonstrate gains in excess of 1 due at least in part to the ordering characteristics imparted by the silicide when the silicon is crystallized in contact with the silicide.

The inventive transistor may be operatively connected to (i.e. capable of permitting current flow to) memory cell diodes disposed in a three dimensional memory array of memory cells above a substrate. Preferably one or more thin film bipolar transistors are disposed in the stacked array above the substrate. A thin film bipolar transistor is one formed from a deposited film as described herein. The array is comprised of multiple monolithically formed levels of memory cells stacked on top of each other. The cells are disposed along wordlines (the bottom conductive elements) extending along memory cell rows and bitlines (the top conductive elements) extending along memory cell columns within a given level of the array. Each memory cell is operatively connected to one or more of the bipolar transistors. Thus, for a given level of memory cells within the array, one or more bipolar transistors will be located at the end of a bitline. Alternatively, one or more bipolar transistors can be located at the end of a wordline, or the wordline and the bitline positions could be reversed, with the bitlines extending along the bottoms of the memory cells and the wordlines extending along the tops. For clarity, this discussion will assume bitlines extend above the memory cells, while wordlines extend below them. The bipolar transistors are operatively connected to one or more CMOS gates or other logic elements or control circuitry disposed on the substrate.

Figure 5:
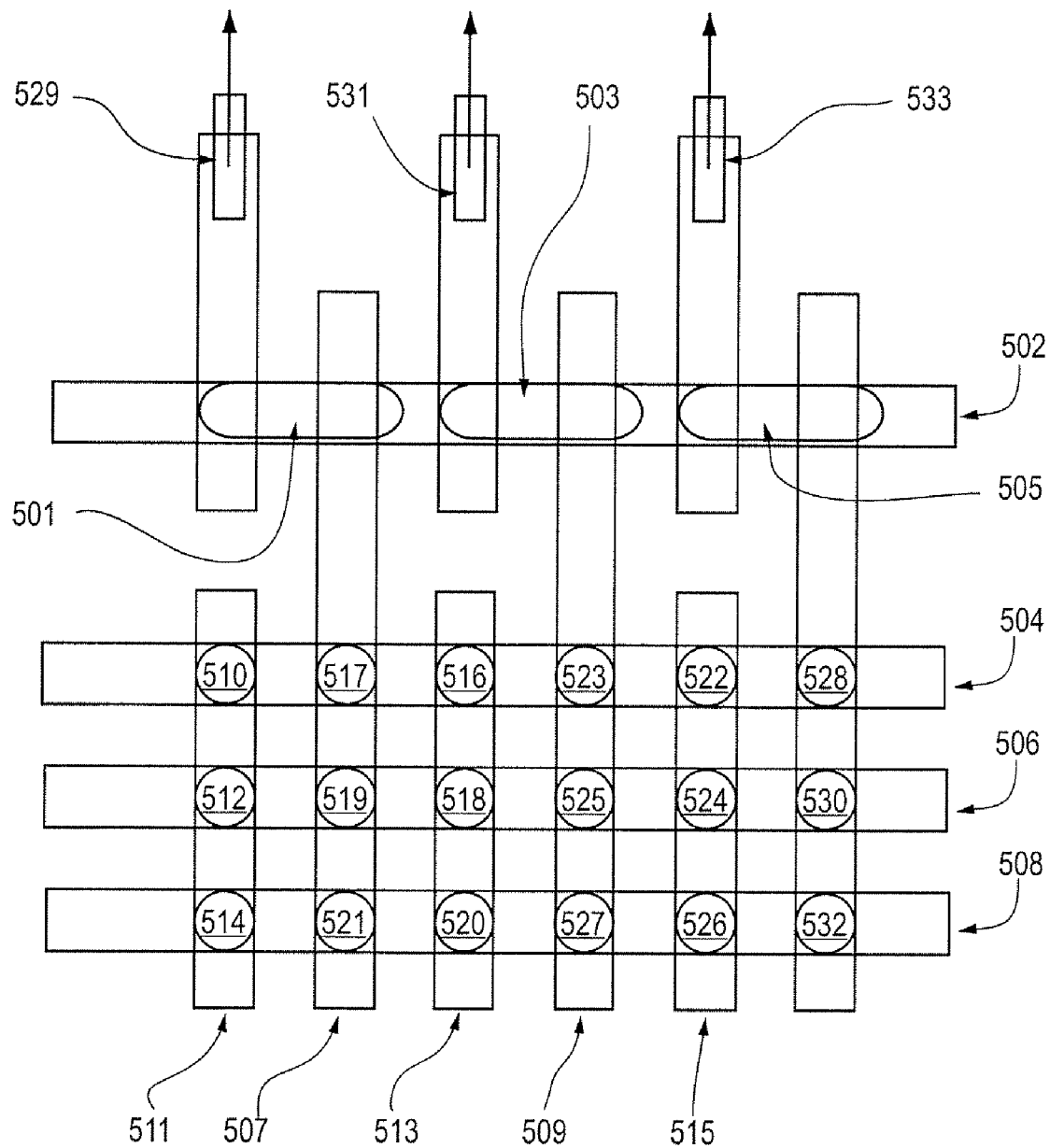
FIG. 5 is a plan view of one bipolar transistor layout in relation to the memory cells within a given level of the memory array.
Figure 6:
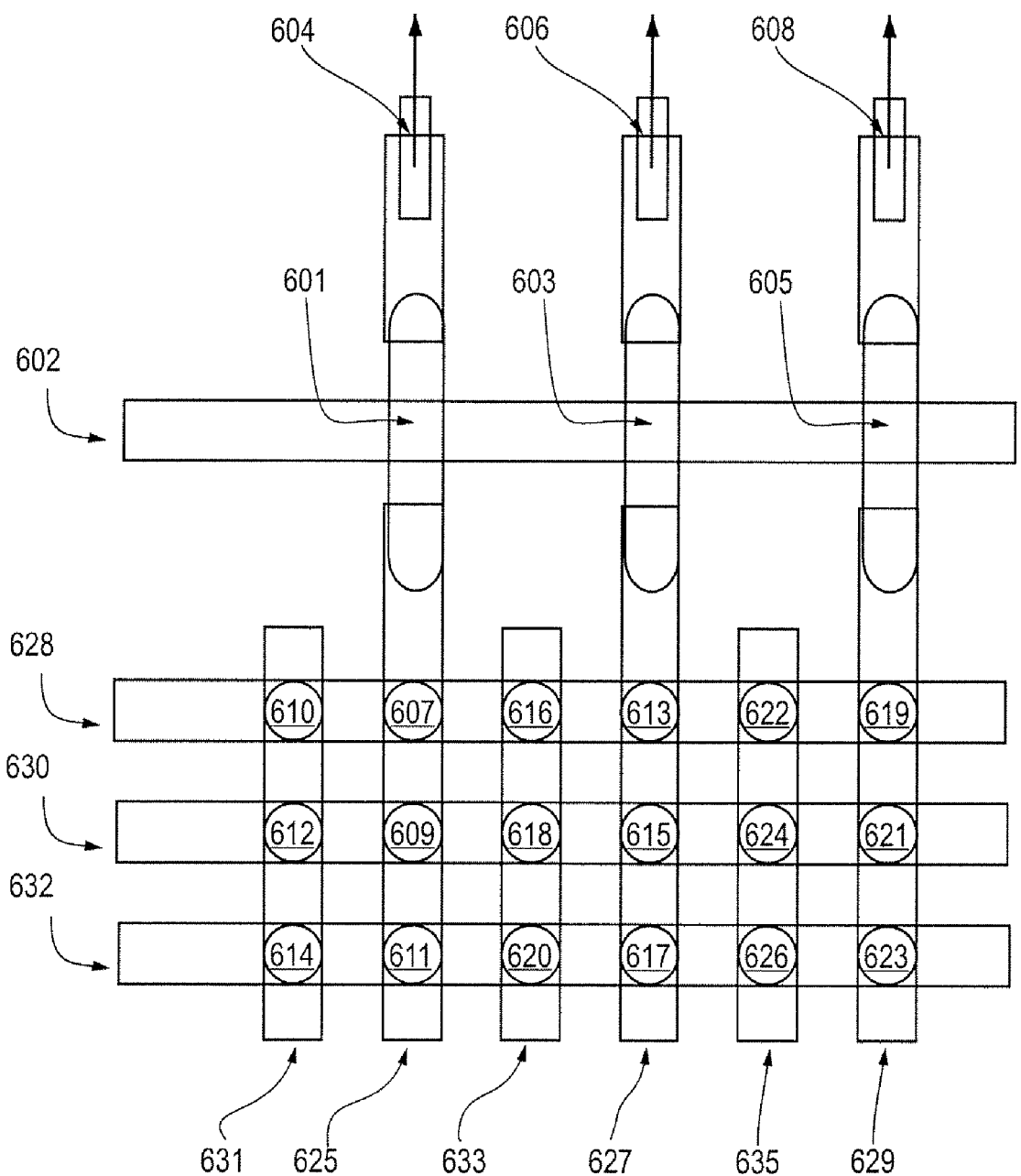
FIG. 6 is a plan view of an alternative bipolar transistor layout in relation to the memory cells within a given level of the memory array.

FIGS. 5 and 6 are top views of possible bipolar transistor layouts within a given level in the array. As can be seen in FIG. 5 the bipolar transistors 501, 503, 505, appearing as ovals in this view, are laid out collinear with conductive element 502, which forms a common connection to the base terminals of all the bipolar transistors 501, 503, 505. This arrangement is well suited to lithography. However, the transistor base width, which is the distance between its collector and emitter regions, is fixed by the memory layer pitch. The collector terminals of the bipolar transistors are operatively connected through conductive elements 507 and 509 (bitlines), to memory cells in this level of the array (each cell is represented as a circle in this view), including cells 517, 519 and 521 and 523, 525 and 527 respectively. These conductive elements 507 and 509 run along the tops of the transistors and the memory cells. Vertical interconnects 529, 531 and 533 connect the emitter terminals of the bipolar transistors to control circuitry, such as one or more field effect transistor located in the substrate (not shown), or to other parts of the array. The bipolar transistors are capable of acting as memory select devices, directing an appropriate programming voltage to the selected memory cells to program those cells. Memory cells 510, 517, 516, 523, 522 and 528 are disposed along conductive element (wordline) 504, which runs along the bottom of the memory cells. Memory cells 512, 519, 518, 525, 524 and 530 are disposed along conductive element (wordline) 506, which runs along the bottom of the memory cells. Memory cells 514, 521, 520, 527, 526 and 532 are disposed along conductive element (wordline) 508, which runs along the bottom of the memory cells.

In FIG. 6, the bipolar transistors 601, 603, 605 are arranged perpendicular to conductive element 602, which forms a common connection to the base terminals of all the bipolar transistors 601, 603, 605. This arrangement accommodates a larger transistor base width, which sometimes is necessary for adequate collector to emitter breakdown voltage. The collector and emitter terminals of the bipolar transistors are connected to control circuitry through contacts 604, 606, 608 and to the various memory cells (represented as circles in this view), essentially as described in the preceding example, except that the areas of contact between the bipolar transistors and the control circuitry and the memory cells occur in different locations as a result of the different geometry of this arrangement. Thus, for example, the emitter terminal of bipolar transistor 601 is connected to control circuitry through contact 604. The collector terminal of bipolar transistor 601 is operatively connected to memory cells 607, 609 and 611 along conductive element 625 (bitline), which runs along the top of the memory cells. The collector terminal of bipolar transistor 603 is operatively connected to memory cells 613, 615, and 617 along conductive element 627 (bitline). The collector terminal of bipolar transistor 605 is operatively connected to memory cells 619, 621 and 623 along conductive element 629 (bitline). Memory cells 610, 607, 616, 613, 622 and 619 are disposed along conductive element (wordline) 628, which runs along the bottom of the memory cells. Memory cells 612, 609, 618, 615, 624 and 621 are disposed along conductive element (wordline) 630, which runs along the bottom of the memory cells. Memory cells 614, 611, 620, 617, 626 and 623 are disposed along conductive element (wordline) 632, which runs along the bottom of the memory cells.

Figure 7:
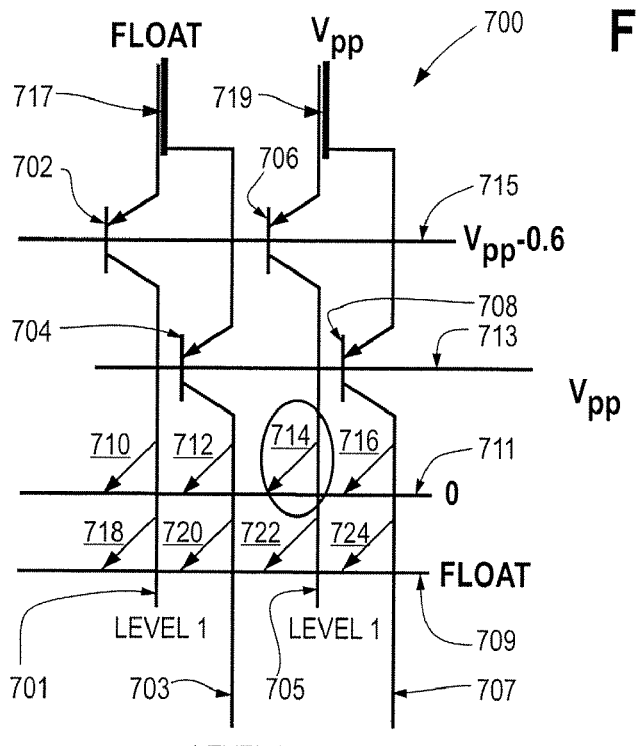
FIG. 7 is a schematic circuit diagram showing a biasing scheme with a single bipolar transistor per line in a monolithic three dimensional memory array.

FIG. 7 is an example of one possible three dimensional schematic circuit diagram 700 showing one embodiment of the inventive bipolar transistors employed as a memory select device in a monolithic three dimensional memory array with one p-n-p transistor per line.

Bipolar transistors 702 and 706 are disposed at the ends of bitlines 701 and 705 connecting the collector terminals of transistors 702 and 706 at a first level within a monolithically formed three dimensional memory array. Bipolar transistors 704 and 708 are disposed at the ends of bitlines 703 and 707 connecting the collector terminals of transistors 704 and 708 at a second level within the monolithic memory array. The base terminals of transistors 702 and 706, on the first level, are connected together by conductive element 715. Similarly, the base terminals of transistors 704 and 708, on the second level, are connected together by conductive element 713. The emitter terminals of transistors 702 and 704 are connected together through connection 717, which connects the first level to the second level of the array. The emitter terminals of transistors 706 and 708 are connected together through connection 719, which connects the first level to the second level of the array. The connections 717 and 719 thus offer access to each set of bitlines in the array, one on each level. The conductive elements 715 and 713 offer access to all of the bitlines on each layer of the array. Connections 717 and 719 can be referred to as the bitline select connections, and conductive elements 715 and 713 can be referred to as the level select lines. The wordline 711 may represent multiple physical conductive elements, one on each level, but they are electrically connected together. The wordline 709 also may represent multiple physical lines, one on each level, that are connected together. More details on this configuration can be found in Scheuerlein et al., US Patent Publication No. 20040188714, "Three-Dimensional Memory Device Incorporating Segmented Bit Line Memory Array," and Scheuerlein, U.S. Pat. No. 6,879,505, "Word Line Arrangement Having Multi-Layer Word Line Segments for Three-Dimensional Memory Array," both owned by the assignee of the present invention and hereby incorporated by reference.

Figure 8:
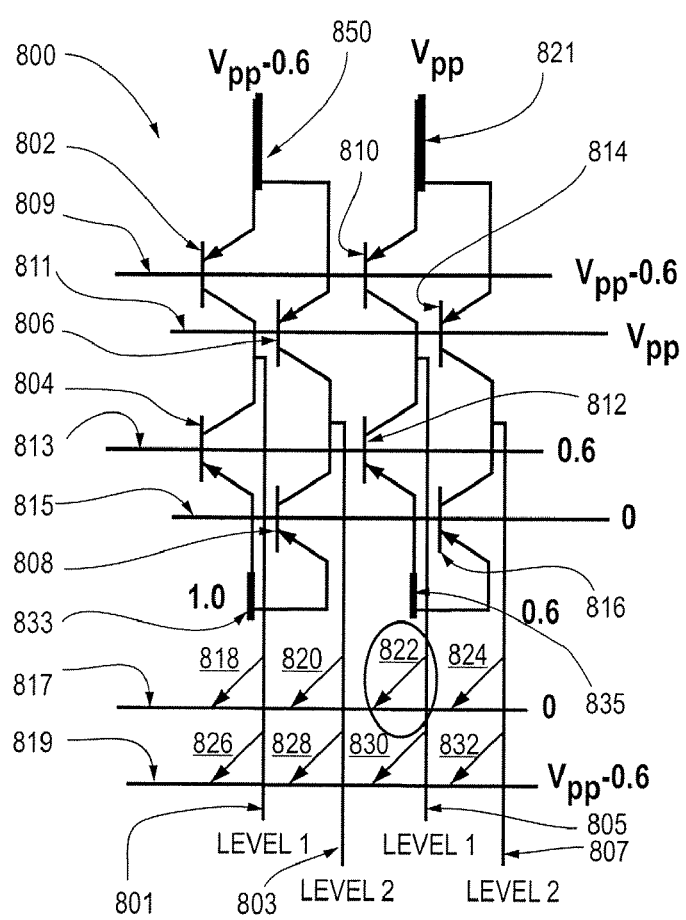
FIG. 8 is a schematic circuit diagram showing a biasing scheme with multiple bipolar transistors per line in a monolithic three dimensional memory array.

Because there is only one bipolar transistor per bitline, other lines must float because there is no device to pull in the other direction. This can have an impact on the speed at which the memory can operate. This is because when a terminal is switched from being connected to a defined voltage and floating, a high impedance is placed between it and the controlling circuitry. It will thus take more time to stabilize at a constant voltage than if such a voltage were directly applied through a low impedance connection. As explained below with respect to FIG. 8, if multiple memory select transistors are included in a given wordline, then it is possible to eliminate floating lines and this effect can be avoided. In programming a memory cell (cell 714 in this example), one or more programming voltages, Vpp, are applied to the circuit at the direction of control circuitry disposed on a substrate (not shown) beneath the array. Vpp is preferably on the order of about 8 volts or less. A smaller programming voltage, on the order of 4-6 volts, is desirable, as it permits better scaling of the device and less potential for damage to other cells during programming. In this example, there is a voltage Vpp applied to the connection 719, which is connected to the selected cell 714 through the bipolar transistor 706, as well as the unselected cells 716 and 724 on the other level. Connection 717, and others like it that are connected to unselected cells on all levels, are left floating. Further describing the circuit, there is a voltage Vpp −0.6 volts applied to level select line 715, which is also connected to the selected cell 714 through the bipolar transistor 706. The voltage Vpp is connected to level select line 713, and others like it that are connected to levels that contain all unselected cells. The wordline 711 connected to the selected cell 714 is grounded. The wordline 709, and others like it connected to unselected cells, on any level, are floated. In this way, a voltage of 0.6 volts is dropped between the emitter and base regions of transistor 706. This transistor thus presents a low resistance to current flow from its emitter and collector, and thus the voltage Vpp is applied to the selected bitline 705. Since the wordline 711 is grounded, the voltage Vpp is applied across the cell 714, which voltage is sufficient to rupture the antifuse of cell 714 and results in the programming of cell 714. Since the wordline 709 is floating, no current can flow through unselected cell 722 on the selected bit line 705, and the cell 722 cannot be programmed. Bipolar transistor 708 also has its emitter connected to Vpp, but its base is also connected to Vpp. Thus it will be in the "cut-off" state, and it will present a high impedance to current flow. Thus the bitline 707 on the unselected level 2 will be effectively floating, and no cell connected to it will be programmed, including cell 716 on the grounded word line. Bipolar transistors 702 and 704 have their emitters floating, thus all cells connected to them on the unselected bitlines 701 and 703 cannot be programmed. Of course, as will be apparent to those skilled in the art, only a very small portion of the first and second memory levels are shown in FIGS. 7 and 8 for purposes of illustration. In reality in a given memory level there will be many more bitline and wordlines, and an array will include millions of cells.

FIG. 8 shows an alternative circuit 800 employing two p-n-p transistors per line as memory select devices in a monolithic three dimensional memory array. One advantage of this arrangement is that it avoids having to float certain lines within the array, for example as discussed above in the previous example with respect to FIG. 7. In this example, inventive p-n-p bipolar transistors 802 and 804 are disposed with their collectors connected together and to bitline 801 at a first level within the array. Transistors 806 and 808 are disposed with their collectors connected together at an end of bitline 803 at a second level within the array above the first level. The emitter terminals of transistors 802 on the first level and 806 on the second level are connected together through connection 850, and the emitter terminals of transistor 804 on the first level and 808 on the second level are connected together through connection 833. Transistors 810 and 812, and 814 and 816 are connected to bitlines 805 and 807 in a similar manner, and pairs of emitters are also connected together through connections 821 and 835. The wordlines 817 and 819 represent multiple wordlines, one on each level, that are electrically connected together, as described above for FIG. 7. Transistors 810 and 812 are operatively connected to memory cell diodes 822 and 830 along bitline 805. Transistors 814 and 816 are disposed along bitline 807 at the second level. Transistors 814 and 816 are operatively connected to memory cell diodes 824 and 832 along bitline 807. Transistors 810 and 812 are connected to transistors 814 and 816 through connections 821 and 835, which connect the first level to the second level.

In programming one of the memory cells, for example cell 822, a programming voltage Vpp is directed by control circuitry disposed in the substrate (not shown) to be applied to connection 821, and a voltage of 0.6 V is applied to connection 835. The level select lines 809 and 813 on the selected levels are held at Vpp −0.6 V and 0.6V, respectively, and other level select lines 811 and 815 are held at Vpp and 0V, respectively. Transistor 810 thus has a bias of 0.6 V across its emitter-base junction and is therefore turned on. Transistor 812 has 0 V across its emitter-base junction and is thus turned off. Bitline 805 is thus raised to Vpp, and, since wordline 817 is grounded, the cell 822 has Vpp applied across its terminals and is thus programmed. Bitline 807 is potentially exposed to the programming voltage Vpp applied at connection 821, but transistor 814 isolates it from Vpp because it is turned off (0 volts across its base-emitter junction). Since transistor 816 is turned on, bitline 807 is thus held at the low voltage (0.6 V) applied to connection 835, and thus cells connected to this bitline (824, 832) will not be programmed. Cells other than the selected cell 822 connected to the selected bit line 805, such as cell 830, will not be programmed because their wordlines are held at Vpp −0.6 V and thus they only have 0.6 V across them. Of the two non-selected bitline connections, connection 850 is held to at most Vpp −0.6 V and connection 833 is held at 1 V. The emitter-base voltage of transistors 802 and 806 are <=0V, so these transistors are turned off. The emitter-base voltages of transistors 804 and 808 are at 0.4 to 1.0 V, so these transistors are turned on, and the unselected bitlines 801 and 803 are held to voltages <1.0 V. Thus, the unselected cells 818, 820, 828, and 826 will not be programmed.

The number of CMOS gates per column footprint is as follows. For one p-n-p bipolar transistor disposed in a given level, as is shown in circuit 700 of FIG. 7, the number of CMOS gates is also one, connected to each common emitter connection (such as 717 and 719). For two p-n-p bipolar transistors disposed in a given line within the array, as is shown in circuit 800 of FIG. 8, the number CMOS gates are two, one connected to the top common-emitter connections (such as 850 and 821) and one connected to the bottom common-emitter connection (such as 833 and 835). Thus circuit 800 has the disadvantage of using a larger CMOS circuit area than circuit 700, although it has the advantage of not having to float any connections. Note that, for zero bipolar transistors disposed at the end of a line within the array, the number of CMOS gates is equal to n, where n is the number of levels in the array. Therefore, the effect of adding bipolar transistors as select devices to the memory levels is to reduce the area required by CMOS gates by a factor of n (for circuit 700) or n/2 (for circuit 800), where n is the number of memory levels.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A semiconductor device comprising a bipolar transistor having a base region, an emitter region and a collector region, wherein the base region comprises deposited silicon, germanium or silicon germanium crystallized in contact with a metal silicide, germanide or silicide-germanide, wherein:
   the transistor is disposed above a substrate, the transistor being in operative connection to a first memory cell formed above the substrate, and
   a first memory level monolithically formed above the substrate comprises the transistor and the first memory cell.

2. The semiconductor device of claim 1 wherein the metal silicide, germanide, or silicide-germanide is titanium silicide.

3. The semiconductor device of claim 1 wherein the metal silicide, germanide, or silicide-germanide is titanium germanide.

4. The semiconductor device of claim 1 wherein the metal silicide, germanide, or silicide-germanide is titanium silicide germanide.

5. The semiconductor device of claim 1 wherein the emitter region and the collector region comprise deposited silicon, germanium or silicon germanium crystallized in contact with a metal silicide, germanide or silicide germanide.

6. The semiconductor device of claim 2 wherein the titanium silicide comprises C49 phase titanium silicide.

7. The semiconductor device of claim 6 wherein the titanium silicide is predominantly C49 phase titanium silicide.

8. The semiconductor device of claim 1 wherein the metal silicide, germanide, or silicide-germanide is cobalt silicide, cobalt germanide or cobalt silicide-germanide.

9. The semiconductor device of claim 1 wherein the transistor is a p-n-p bipolar transistor.

10. The semiconductor device of claim 1 wherein the transistor is a n-p-n bipolar transistor.

11. The semiconductor device of claim 1 wherein the substrate is a silicon wafer.

12. The semiconductor device of claim 1 wherein the substrate comprises one or more of glass, semiconductor material, metal, plastic, silicon dioxide and aluminum oxide.

13. The semiconductor device of claim 1 wherein the first memory cell comprises a diode.

14. The semiconductor device of claim 13 wherein the diode is a vertically oriented p-i-n diode.

15. The semiconductor device of claim 14 wherein a monolithic three dimensional array of memory cells comprises the first memory level.

16. The semiconductor device of claim 15 wherein the monolithic three dimensional memory array further comprising a second memory level monolithically formed above the first memory level.

17. The semiconductor device of claim 16, wherein one or more bipolar transistors are disposed at the first and second memory levels above the substrate and operatively connected to one or more of the memory cells within those memory levels.

18. The semiconductor device of claim 16 wherein the bipolar transistor is capable of selectively programming one or more of the diode memory cells.

19. The semiconductor device of claim 18 wherein the bipolar transistor is connected to a semiconductor element disposed on a substrate.

20. The semiconductor device of claim 19 wherein the semiconductor element comprises logic circuitry.

21. The semiconductor device of claim 19 wherein the semiconductor element comprises a CMOS gate.

22. A monolithic three dimensional memory array comprising:

a plurality of semiconductor elements in a stacked array above a substrate, the array comprising one or more device levels of semiconductor elements;

one or more thin film bipolar transistors disposed in the stacked array above the substrate, each semiconductor element being operatively connected to one or more of the bipolar transistors, wherein the bipolar transistors comprise deposited semiconductor material crystallized in contact with a silicide, germanide, or silicide-germanide.

23. The monolithic three dimensional memory array of claim 22 wherein at least one of the bipolar transistors is capable of selectively programming one or more memory cells.

24. The monolithic three dimensional memory array of claim 22 including at least one p-n-p bipolar transistor.

25. The monolithic three dimensional memory array of claim 22 wherein the substrate is a portion of a silicon wafer.

26. The monolithic three dimensional memory array of claim 22 wherein the substrate comprises one or more of glass, semiconductor material, metal, plastic, silicon dioxide and aluminum oxide.

27. The monolithic three dimensional memory array of claim 22 wherein the silicide, germanide, or silicide-germanide is titanium silicide.

28. The monolithic three dimensional memory array claim 27 wherein the titanium silicide is predominantly C49 phase titanium silicide.

29. The monolithic three dimensional memory array of claim 22 wherein the semiconductor elements comprise diodes.

30. The monolithic three dimensional memory array of claim 29 wherein the diodes comprise vertically oriented p-i-n diodes.

* * * * *